(12) United States Patent
Streck et al.

(10) Patent No.: US 7,595,269 B2
(45) Date of Patent: Sep. 29, 2009

(54) SEMICONDUCTOR DEVICE COMPRISING A COPPER ALLOY AS A BARRIER LAYER IN A COPPER METALLIZATION LAYER

(75) Inventors: Christof Streck, Coswig (DE); Volker Kahlert, Dresden (DE); Alexander Hanke, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 509 days.

(21) Appl. No.: 11/467,216

(22) Filed: Aug. 25, 2006

(65) Prior Publication Data
US 2007/0123043 A1 May 31, 2007

(30) Foreign Application Priority Data
Nov. 30, 2005 (DE) .................. 10 2005 057 075

(51) Int. Cl.
*H01L 21/4763* (2006.01)
*H01L 21/44* (2006.01)

(52) U.S. Cl. .................. 438/687; 438/622; 438/637; 438/642; 438/643; 438/653; 257/E21.476; 257/E21.576; 257/E21.582

(58) Field of Classification Search .......... 257/E21.476, 257/E21.576, E21.582
See application file for complete search history.

(56) References Cited

U.S. PATENT DOCUMENTS

| | | | |
|---|---|---|---|
| 5,955,214 A * | 9/1999 | Bellows et al. ............ | 429/17 |
| 6,309,959 B1 | 10/2001 | Wang et al. ............... | 438/625 |
| 6,432,822 B1 * | 8/2002 | Ngo et al. ................. | 438/687 |
| 6,518,167 B1 | 2/2003 | You et al. ................. | 438/622 |
| 6,562,416 B2 | 5/2003 | Ngo et al. ................. | 427/534 |
| 6,670,271 B1 | 12/2003 | Subramanian et al. ...... | 438/687 |
| 6,844,258 B1 | 1/2005 | Fair et al. ................. | 438/648 |
| 6,875,692 B1 | 4/2005 | Chang et al. .............. | 438/687 |
| 6,919,035 B1 * | 7/2005 | Clough .................... | 252/500 |
| 2002/0032358 A1 * | 3/2002 | Atobe et al. .............. | 588/206 |
| 2003/0072695 A1 * | 4/2003 | Ruelke et al. ............. | 422/186 |
| 2004/0121582 A1 | 6/2004 | Lee ......................... | 438/622 |
| 2005/0224976 A1 * | 10/2005 | Hsu et al. ................. | 257/748 |

FOREIGN PATENT DOCUMENTS

DE 102 40 114 A1 3/2004 .......... 21/768

OTHER PUBLICATIONS

Translation of Official Communication from German Patent Office for German Patent Application No. 10 2005 057 075.5-33 dated Oct. 7, 2006.
Translation of Official Communication from German Patent Office for German Patent Application No. 10 2005 057 075.5-33 dated Jun. 9, 2009.

* cited by examiner

*Primary Examiner*—Savitri Mulpuri
*Assistant Examiner*—Mohsen Ahmadi
(74) *Attorney, Agent, or Firm*—Williams, Morgan & Amerson, P.C.

(57) ABSTRACT

By forming a tin and nickel-containing copper alloy on an exposed copper surface, which is treated to have a copper oxide thereon, a reliable and highly efficient capping layer may be provided. The tin and nickel-containing copper alloy may be formed in a gaseous ambient on the basis of tin hydride and nickel, carbon monoxide in a thermally driven reaction.

14 Claims, 5 Drawing Sheets

SEMICONDUCTOR DEVICE COMPRISING A COPPER ALLOY AS A BARRIER LAYER IN A COPPER METALLIZATION LAYER

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material including a capping layer acting as an efficient diffusion barrier layer for the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 µm and less, a limiting factor of device performance is the signal propagation delay caused by the switching speed of the transistor elements. As the channel length of these transistor elements has now reached 0.1 µm and significantly less, it turns out, however, that the signal propagation delay is no longer limited by the field effect transistors, but is limited, owing to the increased circuit density, by the interconnect lines, since the line-to-line capacitance is increased and the conductivity of the lines is reduced due to their reduced cross-sectional area. The parasitic RC time constants, therefore, require the introduction of new types of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For highly sophisticated applications, in addition to using copper and/or copper alloys, the well-established and well-known dielectric materials silicon dioxide ($k \approx 4.2$) and silicon nitride ($k > 5$) may be replaced by so-called low-k dielectric materials. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper by plating methods, such as electroplating or electroless plating. This damascene technique for forming copper-based metallization layers in standard dielectric materials, such as silicon dioxide, and a plurality of low-k dielectrics, typically requires the formation of a diffusion barrier layer at interfaces with the neighboring dielectric material as copper readily diffuses in a plurality of dielectrics, such as silicon dioxide, and in many low-k dielectrics. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration. For instance, silicon nitride is known as an effective copper diffusion barrier and may be used, for instance, as a capping layer. In other cases, when the moderately high permittivity of silicon nitride is considered inappropriate, nitrogen enriched silicon carbide (SiCN) is frequently used as a copper diffusion barrier. Despite the diffusion hindering effect of the silicon nitride capping layers and silicon carbide-based capping layers, it turns out, however, that copper's resistance against electric current induced material transport (electromigration) strongly depends on the characteristics of an interface between the copper-based metal and the adjacent capping layer. Therefore, in sophisticated integrated circuits featuring high current densities, it is generally preferable to design the deposition process for the capping layer such that a desired high adhesion and thus high performance with respect to electromigration is achieved. For this purpose, corresponding deposition techniques with preceding plasma-based cleaning steps are typically used. With reference to FIGS. 1a and 1b, a typical conventional process flow for forming a SiCN capping layer will now be described in more detail.

FIG. 1a schematically shows a cross-sectional view of a semiconductor device 100 prior to the formation of a silicon nitride or silicon carbide nitride based capping layer on a copper-containing metal region. The semiconductor device 100 comprises a substrate 101 that may include circuit elements, such as transistors, capacitors and the like, which for convenience are not shown. Moreover, the substrate may have formed thereon one or more metallization layers, i.e., dielectric layers in which metal-filled lines and vias are embedded to establish the required electrical connections between the individual circuit elements. For convenience, a single copper-containing metal region 103 is illustrated to represent any copper-based metal lines of one or more metallization layers. The copper-based metal region 103 may be embedded in any appropriate dielectric material, such as silicon dioxide, fluorine-doped silicon dioxide, a low-k material such as hydrogen enriched silicon oxycarbide (SiCOH), appropriate polymer materials or any combination thereof. As previously explained, copper may readily diffuse in a plurality of dielectric materials and hence a conductive barrier layer 102 is typically provided between the dielectric material of the substrate 101 and the copper-containing material of the region 103. The barrier layer 102 may be comprised of two or more individual layers to provide the required characteristics not only in view of the copper diffusion blocking effect, but also with respect to adhesion to the surrounding material, and the diffusion blocking of oxygen, fluorine and other reactive species in to the copper region 103. For example, tantalum, tantalum nitride, titanium, titanium nitride and combinations thereof are frequently used for appropriate materials for the barrier layer 102.

A typical process flow for forming the semiconductor device 100 as shown in FIG. 1a may comprise the following processes. After the formation of any circuit elements, which may exhibit extremely scaled critical dimensions in sophisticated applications, such as a gate length of field effect transistors in the range of approximately 50-100 nm and even less, one or more metallization layers may be formed in accordance with well-established single damascene or dual damascene techniques. That is, an appropriate dielectric layer stack including an etch stop/barrier layer similar to the capping layer that is to be formed on top of the copper-based metal region 103 may be deposited, followed by another dielectric layer, such as silicon dioxide or a low-k dielectric material, which may be formed by well-established techniques, such as plasma enhanced chemical vapor deposition (PECVD), spin-on techniques and the like.

Thereafter, the dielectric layer stack may be patterned by photolithography and etch techniques to form trenches and vias in the dielectric layer stack, wherein the lower etch stop/barrier or capping layer (not shown) may be used as an etch stop. For convenience, only a single trench may be considered for the further explanation, in which the copper-based metal region 103 is to be formed. Thus, after the patterning of the corresponding trench, the barrier layer 102 may be deposited on the basis of well-established deposition techniques, such as sputter deposition, chemical vapor deposition (CVD), atomic layer deposition (ALD) and the like. For instance, well-established recipes for the sputter deposition of tantalum and tantalum nitride as well as titanium and titanium nitride may be used to form the barrier layer 102 having the desired characteristics.

Thereafter, a seed layer (not shown) comprised of, for instance, copper may be formed by sputter deposition or any other appropriate deposition technique. Based on the seed layer, copper may be deposited by, for instance, electroplating or electroless plating, thereby reliably filling the previously formed trenches and vias and also forming the copper-based metal region 103.

Next, excess material deposited during the preceding electrochemical deposition process, as well as the seed layer and the conductive barrier layer 102 formed on portions outside the copper-based metal region 103, may be removed to provide the electrically insulated copper-based metal region 103. For this purpose, a removal process typically comprising a chemical mechanical polishing (CMP) process may be performed, during which a surface 103A of the region 103 is exposed, which may thus be subjected to any chemical reactions, resulting in discolored and eroded or oxidized portions on the surface 103A, since copper may readily react with moisture, oxygen and other traces of gases that may typically be encountered during the removal of the excess material and subsequent substrate handling processes. Consequently, prior to the formation of an insulating capping layer, which may also act as an etch stop layer for the formation of any further metallization layers on top of the substrate 101, the surface 103A is typically cleaned in order to enhance conductivity and the adhesion characteristics and thus the electromigration behavior of the region 103. To this end, frequently a plasma-based treatment may be performed to efficiently remove oxidized, discolored and eroded portions on the surface 103A while at the same time substantially avoiding a re-formation of these portions. For example, a plasma ambient 104 may be established on the basis of ammonia ($NH_3$) and nitrogen ($N_2$), wherein the plasma ignition is typically performed on the basis of radio frequency (RF), the power density of which may significantly determine, in combination with the gas flows of ammonia and nitrogen, the effectiveness of the plasma treatment 104. After the plasma treatment 104, the ambient may be changed by applying appropriate precursor materials so that an appropriate deposition atmosphere may be established in situ, thereby avoiding undue discoloration and oxidation on the exposed surface 103A. After a corresponding stabilization step for introducing the precursor gases, such as 3MS (tri-methylsilane) and ammonia for forming a silicon carbide nitride layer, an appropriate RF power may be supplied to establish a corresponding plasma, thereby initiating the deposition process.

FIG. 1b schematically shows the semiconductor device 100 during this deposition step, wherein, on the basis of the plasma 105 containing 3MS and $NH_3$, a capping layer 106 comprised of nitrogen enriched silicon carbide (SiCN) is formed above the substrate 101 and on the exposed surface 103A, thereby creating a corresponding interface, which is, for convenience, also referred to as 103A. Thereafter, further processing may be continued by forming further metallization layers, wherein the capping layer 106 may act as an etch stop layer for patterning a corresponding dielectric layer stack for forming corresponding vias and trenches.

In other approaches, a silicon nitride layer or a combination of silicon nitride, silicon carbide and nitrogen-enriched silicon carbide may be formed in order to suitably adjust the characteristics. Although good results with respect to the diffusion blocking characteristics may be achieved, significant damage of the exposed copper surface 103A may be observed that is caused by the preceding plasma treatment 104. Moreover, in sophisticated applications, the moderately high permittivity of the capping layer 106 may still result in a significant performance loss. In some approaches, it has been proposed to treat the exposed surface 103A in a plasma with silane and nitrogen to form a copper silicide that may even comprise a significant amount of nitrogen. A corresponding silicide, if sufficiently stable and thick, may replace the capping layer 106, thereby, however, possibly negatively affecting the conductivity of the metal region 103. In other approaches, the plasma treatment is omitted and other pretreatments or deposition regimes for the above-specified dielectric materials may be used, wherein, however, the remaining high permittivity also renders this solution less attractive, while the interface between the copper and the dielectric is still critical in view of electromigration. In still other conventional techniques, the surface 103A is treated to form a silicon and/or nitrogen-containing alloy, allowing omitting the formation of the capping layer 106. In this approach, however, the growth of the alloy is extremely critical and thus process control and device performance may suffer from reduced reliability. Similar difficulties arise from the provision of a copper tungsten/phosphorous alloy, which additionally has to be formed by a wet chemical process, thereby contributing even more to process complexity.

In view of the situation described above, there exists a need for an enhanced technique that enables the formation of copper-based metallization layers including an efficient capping layer while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention addresses the problem of barrier layers for copper-containing metal regions, such as metal lines and vias, in that an exposed copper surface may be treated to receive a tin and nickel-containing alloy, which is known to have superior characteristics with respect to stability, copper diffusion blocking effects and the like. Moreover, the present invention is directed to a technique that enables the formation of a respective tin and nickel-containing copper alloy on exposed copper surface portions by means of a highly efficient manufacturing process on the basis of gaseous precursor materials, which may be efficiently used in combination with a thermally activated reaction, thereby providing the possibility of omitting plasma-based treatments and thus avoiding or at least significantly reducing any deleterious effects associated therewith.

According to one illustrative embodiment of the present invention, a method comprises forming a copper-containing metal region in a first dielectric layer of a metallization layer of a semiconductor device, wherein the copper-containing metal region has an exposed oxidized surface. Furthermore, the method comprises exposing the exposed oxidized surface to a gaseous ambient for converting the oxidized surface into a tin and nickel-containing copper alloy.

According to another illustrative embodiment of the present invention, a method comprises forming an opening in a dielectric layer of a semiconductor device and forming a copper oxide layer on inner walls of the opening. Furthermore, the method comprises converting the copper oxide into a tin and nickel-containing copper alloy by exposing the semiconductor device to a gaseous ambient in order to form a conductive barrier layer. Finally, the method comprises filling the opening with a copper-containing metal.

According to yet another illustrative embodiment of the present invention, a semiconductor device comprises a copper-containing metal region embedded in a dielectric material, wherein the copper-containing metal region comprises a plurality of surface portions. At least one of the plurality of surface portions of the copper-containing metal region comprises a tin and nickel-containing copper alloy, which forms an interface with the dielectric material.

BRIEF DESCRIPTION OF THE DRAWINGS

The invention may be understood by reference to the following description taken in conjunction with the accompanying drawings, in which like reference numerals identify like elements, and in which.

Figure 1A:
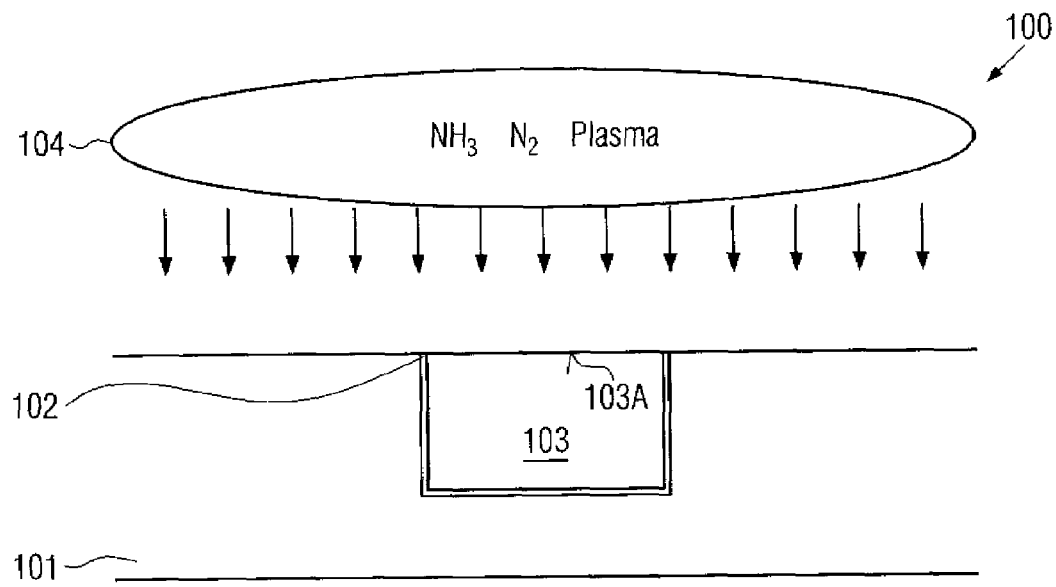
FIGS. 1a-1b schematically show cross-sectional views of a conventional semiconductor device during the formation of a dielectric barrier layer comprising well-established materials, such as nitrogen-enriched silicon carbide, wherein an exposed copper surface is precleaned by means of a plasma treatment.
Figure 1B:
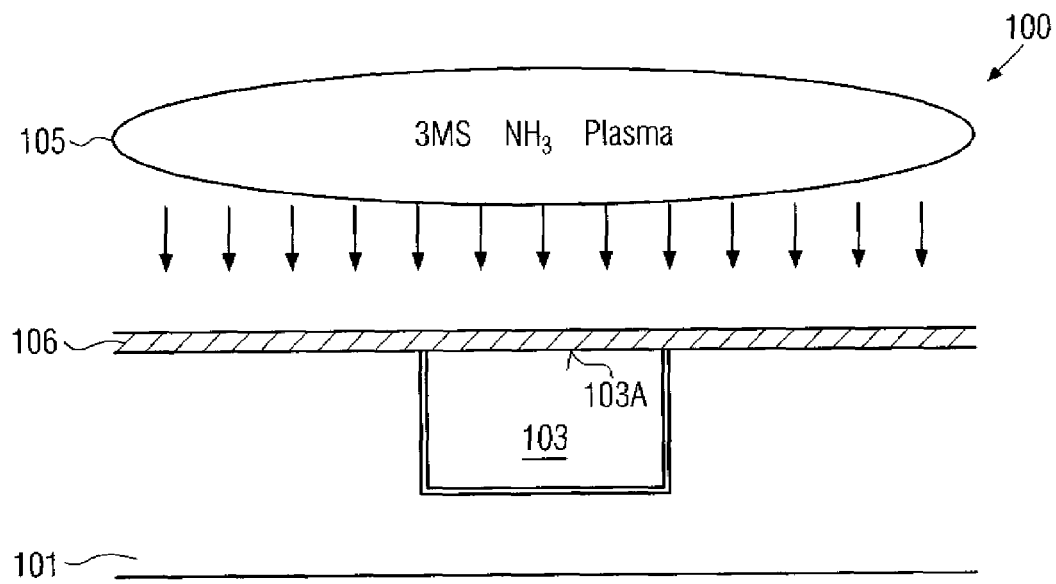

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates a new technique for the formation of a barrier layer or capping layer for copper-containing metal regions, such as metal lines and vias, as are typically used in sophisticated semiconductor devices including metallization layers based on copper, possibly in combination with low-k dielectric materials, wherein moderately high current densities and operating temperatures may be encountered in the metal lines and vias during the operation of the devices. As previously explained, stress induced material transport phenomena in conductive lines and vias may significantly influence the overall reliability and lifetime of semiconductor devices as the failure of even one single conductive line or via within the metallization layer may cause a failure of the device or may at least reduce the reliability thereof. Material transport in metal lines, such as electromigration, which describes the phenomenon of copper diffusion induced by an electric current flowing in a metal line, creating voids and hillocks in the metal line, may significantly depend on the characteristics of diffusion paths that are typically formed at interfaces between two different material layers. Recent investigations seem to confirm that the characteristics of the interface between copper-containing metals and a dielectric capping layer comprising, for instance, silicon nitride, silicon carbide, nitrogen-enriched silicon carbide or any combinations thereof may have a strong influence on the resistance of the metal line to electromigration. Moreover, the negative impact of dielectric capping layers on the overall permittivity of low-k dielectric materials may significantly reduce operating speed and thus performance of sophisticated semiconductor devices. Consequently, the present invention contemplates the provision of a highly reliable and stable tin and nickel-containing copper alloy for providing at least a capping layer that may form a highly stable and reliable interface with a neighboring dielectric material, wherein, in some illustrative embodiments, the adjacent dielectric material may be selected on the basis of performance criteria rather than in view of diffusion and adhesion aspects. Consequently, a very thin dielectric capping layer may be provided or the capping layer may be completely omitted, thereby providing the potential for directly forming a low-k dielectric material on the tin and nickel-containing copper alloy, resulting in a significant performance gain. Furthermore, in some illustrative embodiments, the tin and nickel-containing copper alloy may be provided in the form of a conductive barrier layer within copper-containing trenches and vias, thereby providing the potential for replacing conventional barrier layers, such as tantalum and tantalum nitride-based layers. Thus, a significant increase of performance may be achieved due to the superior conductivity of the tin and nickel-containing copper alloy compared to conventional barrier layer stacks.

Figure 2A:
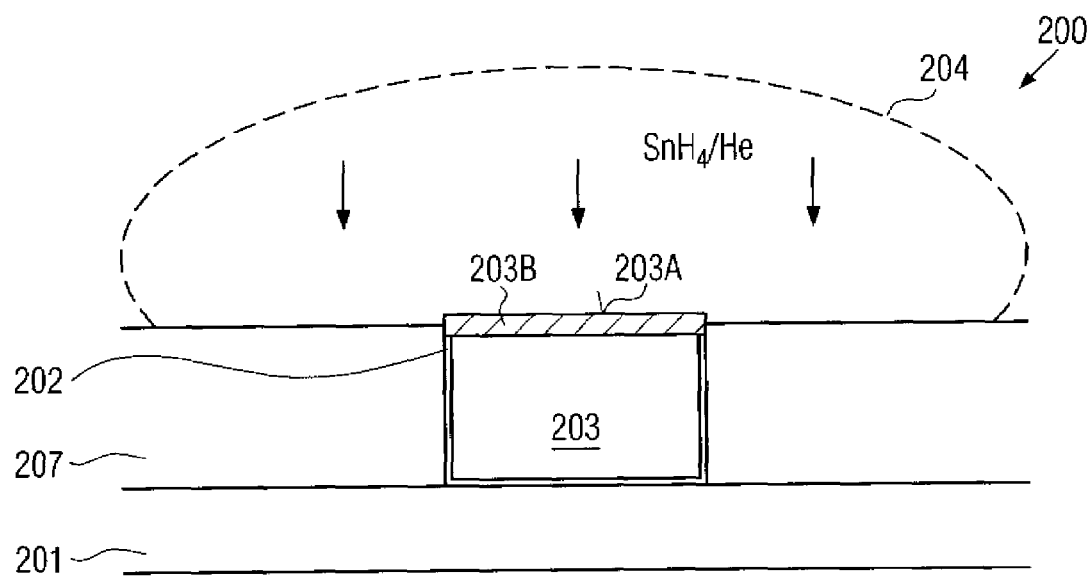
FIGS. 2a-2h schematically show cross-sectional views of a semiconductor device including a copper-containing metal region during various manufacturing stages for forming a tin and nickel-containing copper alloy at least on one surface portion of the copper-containing metal region in accordance with illustrative embodiments of the present invention.

With reference to FIGS. 2a-2h, further illustrative embodiments of the present invention will now be described in more detail. FIG. 2a schematically shows a semiconductor device 200 in cross-sectional view in an advanced manufacturing stage. The semiconductor device 200 may represent a device comprising circuit elements, such as transistors, possibly in combination with other microstructural features for forming mechanical and/or optical components. The device 200 may comprise a substrate 201, which may be provided in the form of a bulk silicon substrate, a silicon-on-insulator (SOI) substrate or any other appropriate semiconductive or insulating carrier having formed thereon an appropriate semiconductor layer for the formation of circuit elements. For convenience, any such circuit elements are not shown in FIG. 2a. Moreover, the device 200 may comprise one or more metallization layers including copper-containing metal lines and vias, wherein, for convenience, a single metallization layer 207 is depicted in FIG. 2a. The metallization layer 207 may comprise any appropriate dielectric material and may further include one or more copper-containing metal regions 203, wherein the copper-containing metal region 203 may represent a metal line embedded in the dielectric material of the layer 207. The dielectric material of the layer 207 may be provided in the form of silicon dioxide, fluorine-doped silicon dioxide, a low-k dielectric material, such as SiCOH, polymer materials, or any combination thereof. In this respect, it should be appreciated that a low-k dielectric material is to be understood as a material having a relative permittivity of 3.0 or less. The copper-containing metal region 203 may comprise a conductive barrier layer 202 formed of any appropriate barrier/adhesion material, such as tantalum, tantalum nitride, titanium, titanium nitride, tungsten nitride, or any combination thereof, or any other appropriate materials. The barrier layer 202 may be formed of two or more individual layers of different material composition to provide the required barrier and adhesion characteristics. In other illustrative embodiments, as will be described in more detail later on, the barrier layer 202 may be comprised of a tin and nickel-containing copper alloy, possibly in combination with other materials. The semiconductor device 200 is shown in a manufacturing sequence, in which a surface 203A is exposed and may comprise copper oxide which may form a substantially continuous copper oxide layer 203B having a thickness of several tenths of Angstrom to several tenths of nanometer. It should be appreciated that the term "copper-containing metal region" as is used for the region 203 may be understood to also include the copper oxide contained in the region 203B, although copper oxide may not generally be referred to as a metal.

A typical process flow for forming the semiconductor device 200 as shown in FIG. 2a may comprise substantially the same processes as are previously described with reference to the device 100. That is, well-established process techniques may be used for forming any circuit elements and other microstructural features followed by well-established single or dual inlaid techniques for the formation of the metallization layer 207. During the process sequence for forming the metallization layer 207, the surface 203A may have been exposed, for instance by CMP, to provide the copper-containing region as an electrically insulated conductive region, as is previously described. After the exposure of the copper surface 203A, the device 200 may be subjected to any appropriate treatment for oxidizing the surface 203A, thereby forming the copper oxide layer 203B. For example, after the CMP process and any further manufacturing processes for cleaning or adapting the crystalline structure of the copper material in the region 203, an oxidizing ambient may be established, in which the copper of the region 203 may readily react with the oxygen to form a copper oxide in the form of $Cu_xO_y$, wherein any process parameters may be readily adjusted to achieve a thickness of the layer 203B as is dictated by process or device requirements. For instance, in some illustrative embodiments, the above-defined thickness range may be achieved by any appropriate treatment on the basis of oxygen, moisture and the like. It should be appreciated that any copper oxidation process scheme, which is typically undesirable in the conventional process flow, may be advantageously used to form the copper oxide layer 203B, wherein the substantially continuous layer 203B may also act as a "passivation" layer, if the further processing of the semiconductor device 200 is continued in a substantially oxygen-free atmosphere. In other embodiments, the surface 203A, after forming the copper-containing metal region 203, may be treated by any appropriate material which may be used for passivating the copper surface and which may preferably be removed without a plasma treatment prior to the formation of the copper oxide surface 203B.

After the formation of the copper oxide layer 203B, in one illustrative embodiment, the semiconductor device 200 may be exposed to a gaseous ambient 204, which may be established in any appropriate process chamber, such as a CVD deposition chamber and the like. The gaseous ambient 204 may include at least temporarily a precursor gas that contains tin, such as tin hydride ($SnH_4$), which may be provided with an appropriate carrier gas, such as helium or any other appropriate substantially inert gas in order to appropriately adapt the concentration of the tin hydride in the gaseous ambient 204. In one illustrative embodiment, the formation of the copper oxide layer 203B may also be accomplished within the gaseous ambient 204, prior to supplying the tin-containing precursor gas thereto, so that the copper oxide layer 203B and the subsequent treatment on the basis of the tin-containing precursor gas may be performed in situ. When exposed to the ambient 204, containing at this phase the tin-containing precursor gas, an appropriate temperature may be selected, for instance in the range from room temperature up to approximately 350° C., and the copper oxide in the layer 203B may be reduced according to the following formula:

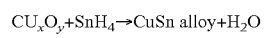

$$Cu_xO_y + SnH_4 \rightarrow CuSn\ alloy + H_2O$$

According to this reduction reaction, a copper tin alloy may be formed, wherein the reaction is a thermal driven process, thereby substantially not damaging the surface 203A. Consequently, the initial crystallinity of the copper in the region 203 may be substantially maintained, contrary to conventional approaches requiring the treatment by a highly reactive plasma.

Figure 2B:
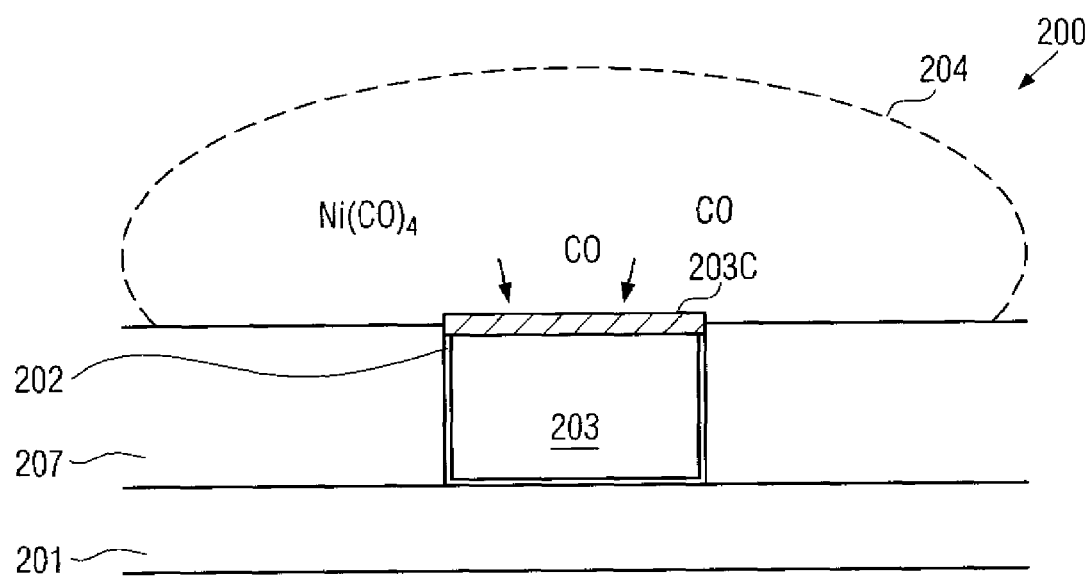

FIG. 2b schematically shows the semiconductor device 200 in an advanced stage, in which the gaseous ambient 204 is altered to now comprise additionally or alternatively to the tin-containing precursor a nickel-containing gas, such as a nickel and carbon monoxide-containing gas ($Ni(CO)_4$), which partially decomposes according to the following formula:

Consequently, atomic nickel may deposit on the copper tin alloy in order to form a nickel and tin-containing copper alloy according to the following formula:

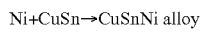

The incorporation of nickel into the copper tin alloy in the surface 203A within the gaseous ambient 204 is also a thermally driven reaction, wherein any appropriate reaction temperature in the range of room temperature up to approximately 400° C. may be selected so as to correspondingly adjust the growth process for the tin and nickel-containing copper alloy. For example, for a given thickness of the initial copper oxide layer 203B, for instance in the above-defined range, the final composition of the tin and nickel-containing copper alloy, which is now indicated as 203C, may be adjusted on the basis of process parameters for establishing the gaseous ambient 204, wherein, for instance, in the initial phase shown in FIG. 2a, the process parameters, for instance the process time for a given temperature and gas concentration, may be selected such that a substantially complete reduction of the copper oxide is accomplished. Thereafter, the gaseous ambient 204 may be modified as is shown in FIG. 2b, wherein, based on the process temperature, the flow rate for the nickel-containing precursor gas, the flow rate of carbon monoxide, if separately supplied to the ambient 204, the process time and the like, may be correspondingly adjusted to control the ratio of nickel within the tin and nickel-containing copper alloy 203C. Corresponding process parameters may be readily determined on the basis of corresponding test runs, wherein, for instance, appropriate process parameter values may be determined for the specified process chamber used for establishing the gaseous ambient 204, since the respective parameters may depend on the configuration of the process chamber. For example, different nickel contents as well as the characteristics of the resulting tin and nickel-containing copper alloy may be examined in relation to the process parameter values used in the preceding test runs and appropriate target values may then be determined in accordance with device requirements. After the formation of the tin and nickel-containing copper alloy at the surface of the region 203, wherein the resulting layer may also be considered as a conductive capping layer which will further be indicated as 203C, the manufacturing process may be continued by depositing any appropriate dielectric material as may be required for the formation of a further metallization layer.

Figure 2C:
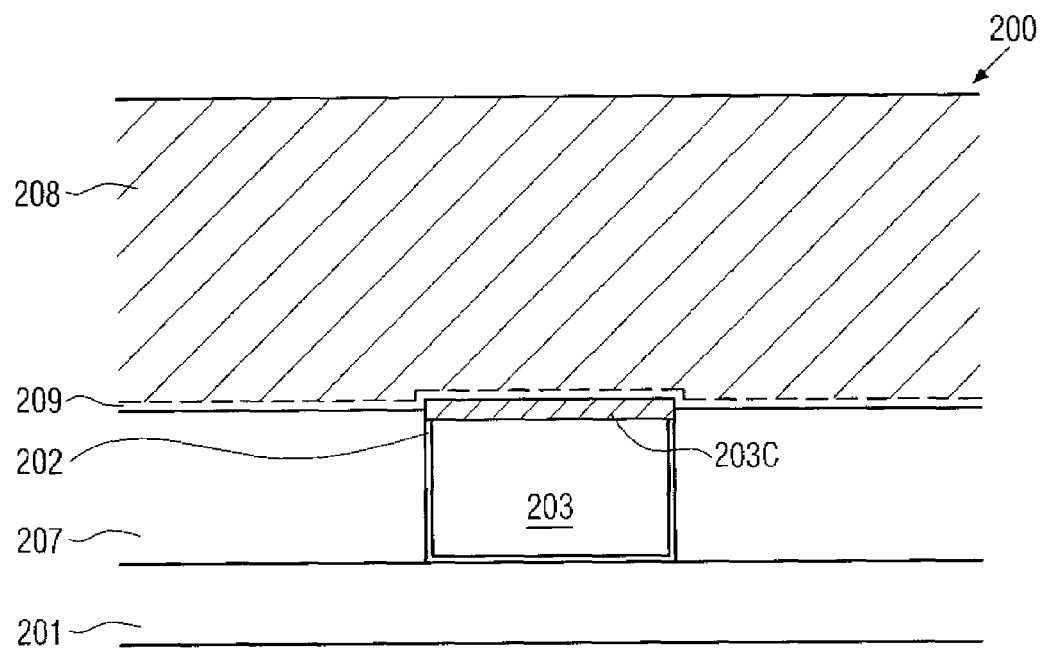

FIG. 2c schematically shows the semiconductor device 200 after the deposition of a dielectric layer 208, which, in illustrative embodiments, may comprise a low-k dielectric material. In some embodiments, the dielectric layer 208 may comprise an optional etch stop layer or etch indicator layer 209 which, according to the present invention, may be selected with respect to etch specific characteristics, rather than selecting the optional etch stop layer 209 in view of its barrier and adhesion characteristics, as is the case in the conventional techniques. For example, the optional etch stop or etch indicator layer 209 may be comprised of silicon dioxide, which may, for instance, be doped with fluorine to reduce the relative permittivity thereof. In other embodiments, any other appropriate material may be used, whereas, in other illustrative embodiments, the dielectric layer 208 may be provided as a substantially continuous layer without providing the optional layer 209, wherein the layer 208 may be comprised of a low-k dielectric material. In one embodiment, the deposition of the layer 208 and, if provided, of the layer 209 may be performed in the same process chamber as is used for the preceding formation of the capping layer 203C, that is, for the establishment of the gaseous ambient 204.

As a result, the present invention provides an enhanced technique for the formation of a reliable and stable conductive capping layer in a self-aligned fashion, wherein a well-approved tin and nickel-containing copper alloy is formed on the basis of a gaseous ambient, in which the conversion of copper oxide is driven by a thermal reaction, thereby reducing plasma-induced damage of the underlying metal. Moreover, by correspondingly adapting the process parameters of the gaseous ambient 204, a wide range of values for the ratio of copper, tin and nickel may be selected, wherein a high controllability of the formation process may provide enhanced process robustness, compared to conventional strategies for forming silicon or nitrogen-based alloys or tungsten and phosphorous-based alloys. Furthermore, the superior chemical, mechanical and electrical characteristics of the tin and nickel-containing copper alloy provide the potential of enhancing the device performance, for instance in terms of reliability, due to an enhanced electromigration behavior. It should be appreciated that in the above illustrated embodiments it is referred to the metallization layer 207, in which the copper-containing metal region 203 represents a metal line. It should be understood that the metallization layer 207 may, in other embodiments, represent any device area in which is formed a copper-containing metal region which is to receive at least one surface portion thereof a tin and nickel-containing copper alloy. Consequently, the present invention should not be considered as being restricted to the formation of copper regions in metallization layers, unless such restrictions are specifically referred to in the appended claims. As previously explained, the region 203 typically comprises a plurality of surface portions, one of which is represented by the layer 203C, while other surface portions are typically covered by the barrier layer 202. As previously indicated, the barrier layer 202 may also be comprised of a tin and nickel-containing copper alloy so as to act as an efficient diffusion barrier with respect to the surrounding dielectric material, which may be represented by the layer 207 and the underlying substrate 201.

With reference to FIGS. 2d-2h, a further manufacturing sequence based on the device 200 as shown in FIG. 2c may refer to the formation of a conductive barrier layer, such as the layer 202, in which a plurality of surface portions of a copper-containing metal region are provided with a respective tin and nickel-containing copper alloy. In the following illustrative embodiments, it is referred to the formation of a via and a metal line in accordance with a dual damascene technique as an exemplary process flow for forming a conductive barrier layer. However, other regimes, such as single inlaid techniques, may also be used in conformity with the principles of the present invention.

Figure 2D:
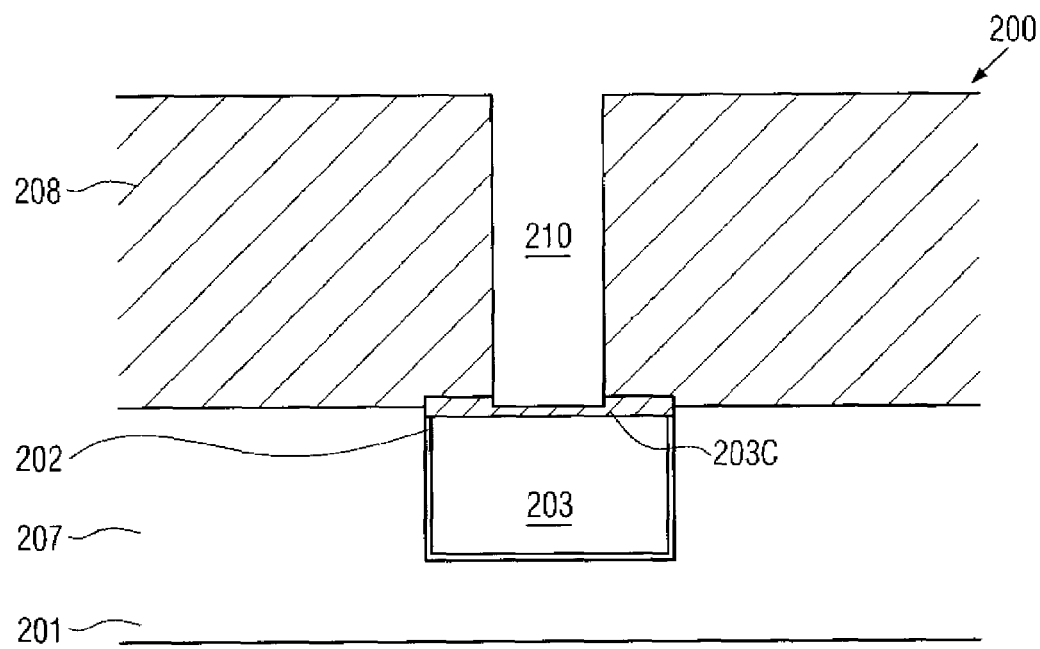

FIG. 2d schematically shows the semiconductor device 200 in a further advanced manufacturing stage, in which a via opening 210 is formed in the dielectric layer 208, wherein the via opening 210 may extend into the capping layer 203C. The via opening 210 may be formed by an anisotropic etch process on the basis of well-established photolithography techniques, wherein, in some embodiments, the dielectric layer 208 may be provided without any etch stop or etch indicator layers, as the etch process may be controlled on the basis of the barrier layer 203C. For example, the release of nickel, copper, tin, may be used as an indicator for controlling the etch process on the basis of optical spectroscopy. Well-established etch recipes for etching through a plurality of low-k dielectric materials may be used, wherein the layer 203C may act as an etch stop layer. Due to the moderately high conductivity of the tin and nickel-containing copper alloy in the layer 203C, a certain amount of non-uniformity in the penetration depth across the substrate 201 may not significantly negatively affect the resulting interconnect structure, since a variation in penetration depth, even if the via opening 210 extends completely through the layer 203C, may be substantially compensated for in a subsequent metal fill process.

Figure 2E:
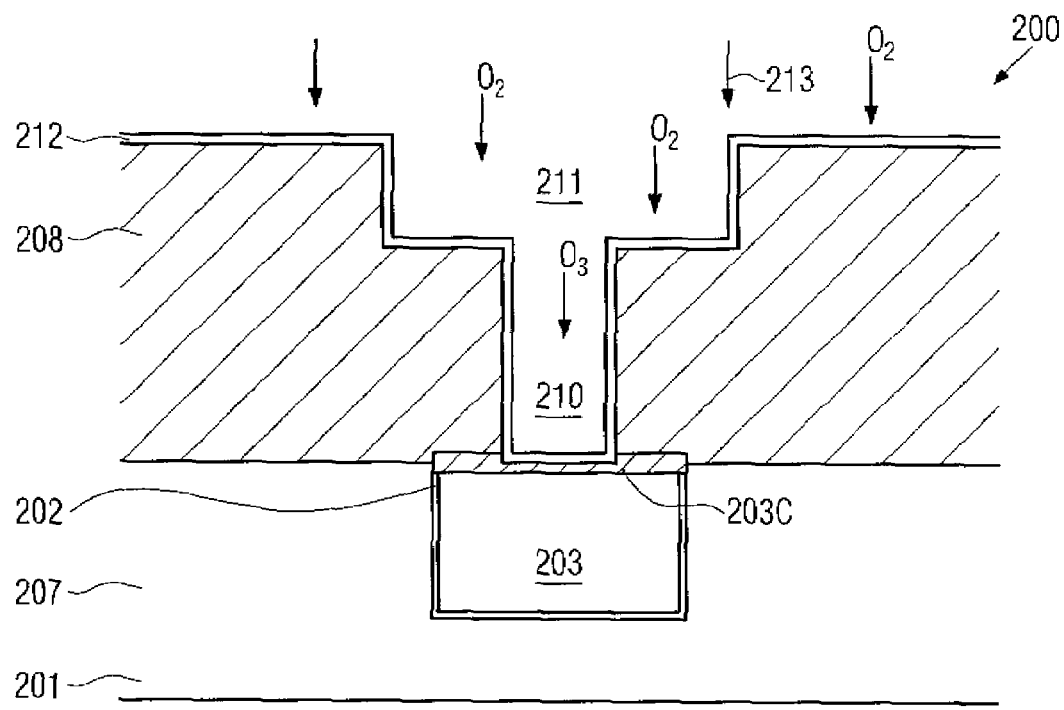
Figure 2F:
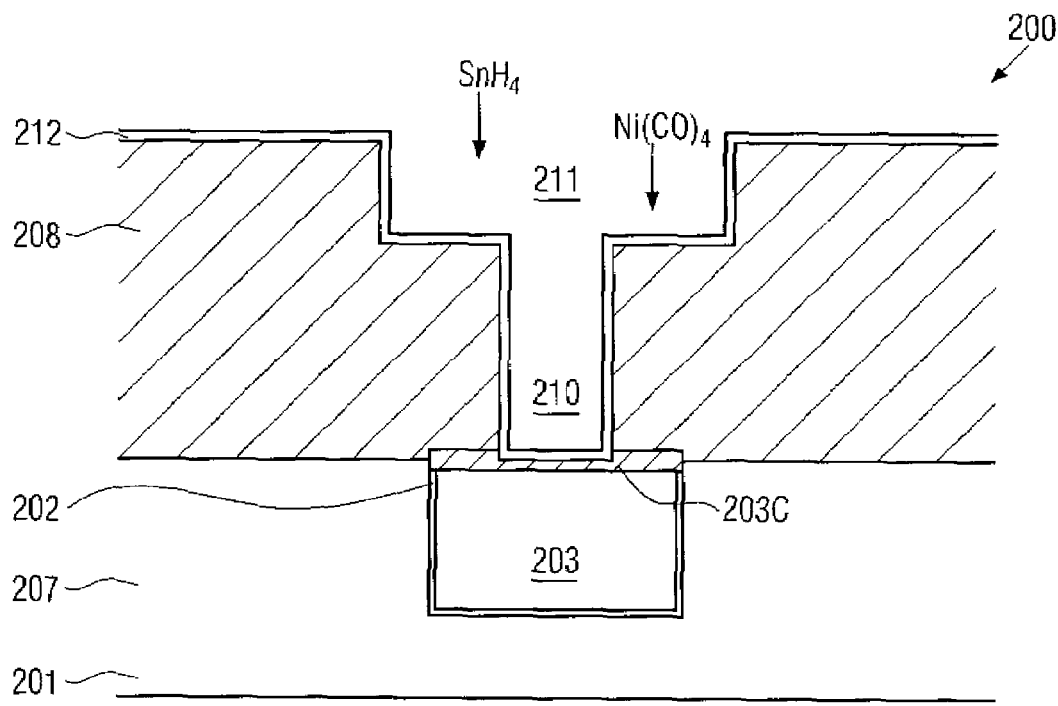

FIG. 2e schematically shows the semiconductor device 200 in a further advanced manufacturing stage. Here, a trench 211 is formed above the via opening 210, wherein, as previously explained, it should be appreciated that any other regime may be contemplated, for instance the subsequently described sequence for forming a conductive barrier layer may also be applied to the via opening 210 without forming the trench 211. Moreover, on inner walls of the via openings 210 and the trench 211, i.e., on respective surface portions thereof, and on horizontal portions of the dielectric layer 208, a copper oxide layer 212 is formed. In one illustrative embodiment, the copper oxide layer 212 may be formed by first depositing a copper layer, for instance on the basis of physical vapor deposition, such as sputter deposition or electroless deposition, or any other appropriate deposition technique. For example, well-established sputter deposition recipes are well-established for sophisticated semiconductor devices, which may be used in combination with the present invention. Thereafter, the semiconductor device 200 may be exposed to an oxidizing ambient 213 to convert the copper as deposited into copper oxide. In other illustrative embodiments, copper may be deposited in the presence of the oxidizing ambient 213, thereby forming the copper oxide upon deposition of copper on exposed surfaces of the device 200. For example, in a sputter deposition tool, an oxidizing ambient may be established during the deposition, wherein an oxidation of the target material may not negatively influence the deposition process, since the copper oxide forming on the target material may be continuously removed due to the ion bombardment of the ionized carrier gas. A corresponding immediate oxidation of the deposited copper may be advantageous in view of negligible copper diffusion into the dielectric layer 208, thereby avoiding undue contamination of device areas. In other illustrative embodiments, a copper diffusion barrier may be provided in one or more lower-lying metallization layers, thereby efficiently reducing the diffusion of any copper into sensitive semiconductor areas, even if a certain degree of copper diffusion may occur during the formation of the copper oxide layer 212.

FIG. 2e schematically shows the semiconductor device 200 in a further advanced manufacturing stage, in which a gaseous ambient is established, for instance in a similar way as the gaseous ambient 204, to provide tin hydride and nickel and carbon monoxide containing precursor gases, subsequently or overlapping or simultaneously, for converting the copper oxide in the layer 212 in a respective tin and nickel-containing copper alloy, as is for instance also described with reference to the layer 203C. Consequently, the barrier layer 212 is now substantially comprised of the highly conductive tin and nickel-containing copper alloy having the required chemical, mechanical and electrical characteristics for providing copper in the trench 211 and in the via opening 210. In one illustrative embodiment, the layer 212 may be used as a seed or catalyst layer for a subsequent electrochemical deposition, such as electroplating or electroless plating. In other illustrative embodiments, a further seed layer (not shown) may be formed on the barrier layer 212 prior to a subsequent electrochemical deposition of copper.

Figure 2G:
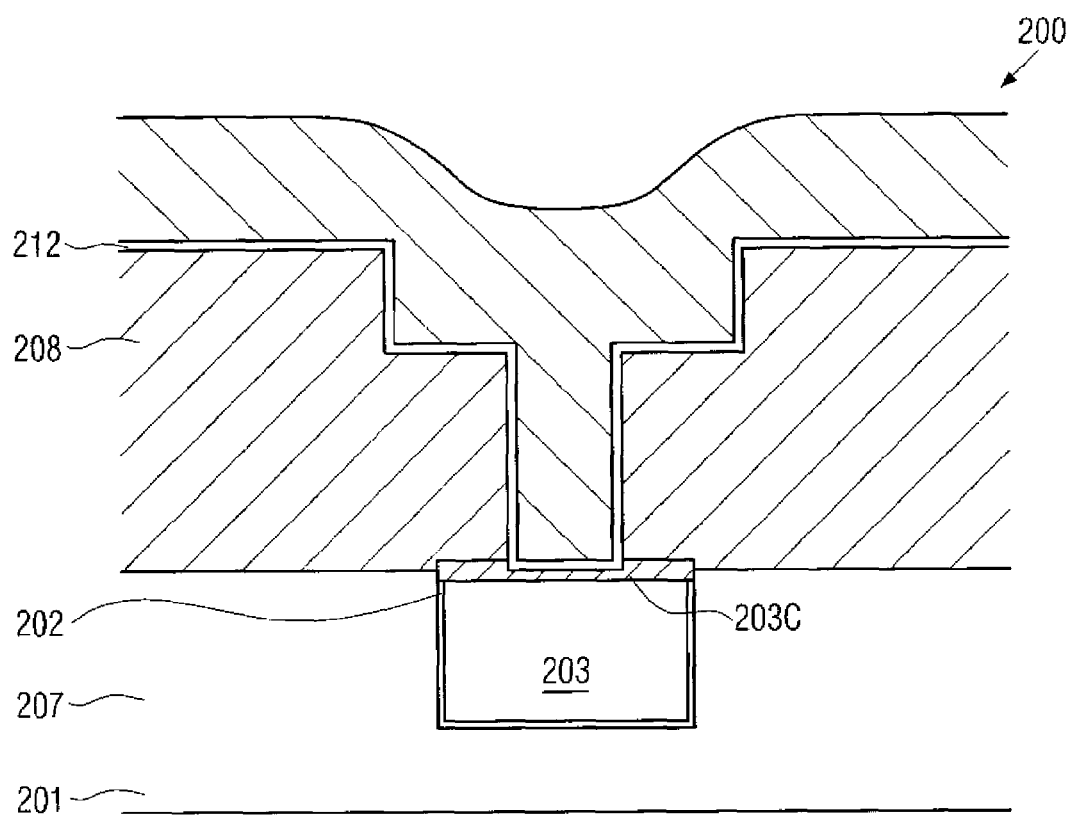

FIG. 2g schematically shows the semiconductor device 200 after the deposition of copper, thereby forming a copper layer 214. Subsequently, any excess material of the layer 214 and also of the layer 212 may be removed on the basis of electrochemical polishing techniques and/or CMP based on well-established recipes.

Figure 2H:
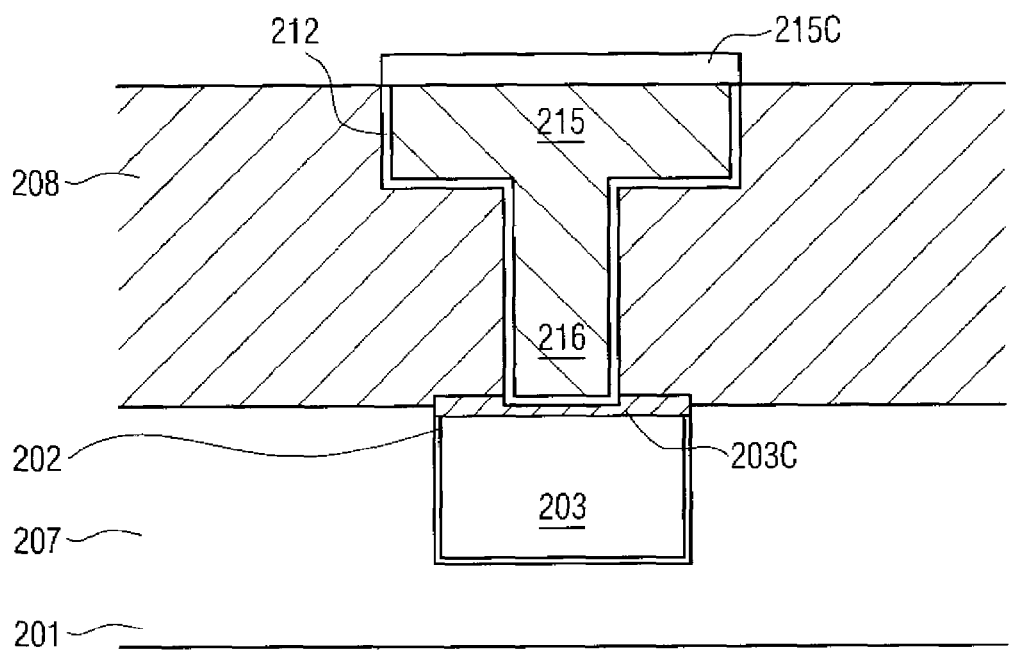

FIG. 2h schematically shows the semiconductor device 200 in a further advanced manufacturing stage after the removal of any excess material, thereby providing a metal line 215 connected to a corresponding via 216 as copper-containing metal regions, wherein respective surface portions of the metal line 215 and the via 216 are formed by the highly conductive barrier layer 212 comprised of the tin and nickel-containing copper alloy. Moreover, a capping layer 215C may be formed at an upper surface portion of the metal line 215, wherein the capping layer 215C may be comprised of a tin and nickel-containing copper alloy, which may be formed in substantially the same way as previously described with reference to the capping layer 203C (FIG. 2e). Consequently, the plurality of surface portions of the metal line 215 and of the via 216 may be reliably covered by the tin and nickel-containing copper alloy, thereby providing enhanced performance with respect to conductivity and reliability, since the barrier layer 212 has a significantly higher conductivity compared to conventional conductive barrier layers, whereas the capping layer 215C provides enhanced electromigration characteristics compared to conventional dielectric capping layers.

As a result, the present invention provides a new technique for forming a tin and nickel-containing copper alloy on respective surface portions of a copper-containing metal region, thereby providing enhanced mechanical, electrical and chemical characteristics compared to conventional capping layers and barrier layers. For this purpose, a copper oxide layer is formed on one or more exposed surface portions of a metal region under consideration, which is subsequently converted into the tin and nickel-containing copper alloy on the basis of appropriate precursor gases in a gaseous ambient, wherein the entire process sequence is a thermally driven reaction, thereby reducing or avoiding any plasma-induced damage on the underlying copper-containing metal. Moreover, in some illustrative embodiments, the formation of the tin and nickel-containing copper alloy may be combined with the deposition of an appropriate dielectric material, which may be accomplished within a single process chamber, thereby providing an in situ process and also contributing to reduced process complexity while still providing enhanced performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming a copper-containing metal region in a first dielectric layer of a metallization layer of a semiconductor device, said copper-containing metal region having an exposed oxidized surface; and exposing said exposed oxidized surface to a gaseous ambient comprising at least temporarily a tin hydride gas ($SnH_4$) and comprising at least temporarily a nickel and carbon monoxide containing gas for converting said oxidized surface into a tin and nickel-containing copper alloy.

2. The method of claim 1, further comprising depositing a second dielectric layer on said first dielectric layer and said tin and nickel-containing alloy.

3. The method of claim 2, wherein said second dielectric layer is formed in situ with said tin and nickel-containing copper alloy.

4. The method of claim 1, further comprising treating said copper-containing metal region in an oxidizing ambient to form said exposed oxidized surface.

5. The method of claim 1, further comprising:

forming a dielectric layer above said copper-containing metal region;

forming an opening in said dielectric layer to expose said tin and nickel-containing copper alloy;

forming a first copper oxide layer on inner walls of said opening;

converting said first copper oxide layer into a conductive barrier layer comprising a first tin and nickel-containing copper alloy by exposing said semiconductor device to a gaseous ambient to form said conductive barrier layer; and filling said opening with a copper-containing metal.

6. The method of claim 5, wherein said gaseous ambient comprises at least temporarily a tin hydride gas ($SnH_4$).

7. The method of claim 5, wherein said gaseous ambient comprises at least temporarily a nickel and carbon monoxide containing gas.

8. The method of claim 5, wherein forming said first copper oxide layer comprises depositing copper and exposing the semiconductor device to an oxidizing ambient.

9. The method of claim 5, wherein forming said copper oxide layer comprises depositing copper in an oxidizing ambient.

10. The method of claim 5, wherein filling said opening with a copper-containing metal comprises filling in said metal by an electrochemical process and removing excess material of said copper-containing metal and said barrier layer outside of said filled opening to form an exposed metal surface.

11. The method of claim 10, further comprising treating said exposed metal surface to form a second copper oxide layer thereon.

12. The method of claim 11, further comprising treating said second copper oxide layer in a gaseous ambient to form a tin and nickel-containing alloy on said second copper oxide layer.

13. The method of claim 5, wherein said copper-containing metal is deposited on said conductive barrier layer.

14. The method of claim 5, wherein filling said opening with a copper-containing metal comprises forming a seed layer on said barrier layer.

* * * * *